United States Patent [19]

Nagai et al.

[11] Patent Number: 4,914,668
[45] Date of Patent: Apr. 3, 1990

[54] SEMICONDUCTOR LASER INCLUDING A REFLECTION FILM

[75] Inventors: Yutaka Nagai; Yutaka Mihashi; Kenji Ikeda; Yoichiro Ota, all of Itami, Japan

[73] Assignee: Mitsubishi Denki Kabushiki Kaisha, Japan

[21] Appl. No.: 308,744

[22] Filed: Feb. 10, 1989

[30] Foreign Application Priority Data

Feb. 12, 1988 [JP] Japan .................................. 63-31201

[51] Int. Cl.$^4$ .............................................. H01S 3/19
[52] U.S. Cl. ........................................ 372/49; 372/36; 357/81
[58] Field of Search ...................... 372/49, 43, 44, 36, 372/50, 99, 92, 32, 29; 357/81, 80, 19

[56] References Cited

U.S. PATENT DOCUMENTS 4,092,659 5/1978 Ettenberg .............................. 372/49
4,546,478 10/1985 Shimizu et al. ...................... 357/81
4,731,792 3/1988 Shimizu et al. ...................... 372/49

OTHER PUBLICATIONS

Ettenberg, "A New Dielectric Facet Reflector for Semiconductor Lasers", Appl. Phys. Lett. 32 (11), Jun. 1, 1978, pp. 724–725.
Shimizu et al., "Noise Characteristic of High Reflectivity Facet TRS Laser", Semiconductor Laboratory of Matsushita Electronic Engineering Co., Ltd., Japanese Society of Applied Physics, 29a-M-9, 1984.
Endou et al., "Noise Characteristic of High Reflectivity Facet BCM Laser", Japanese Society of Applied Physics 13a-R-4, Nippon Denki Kabushiki Kaisha, 1984.

Primary Examiner—William L. Sikes
Assistant Examiner—Georgia Y. Epps
Attorney, Agent, or Firm—Leydig, Voit & Mayer

[57] ABSTRACT

A semiconductor laser device for a laser printer in which a reflection film having reflectance in a range of 45 to 65% is provided on a laser output facet for outputting a laser output beam.

12 Claims, 5 Drawing Sheets

SEMICONDUCTOR LASER INCLUDING A REFLECTION FILM

FIELD OF THE INVENTION

The present invention relates to a semiconductor laser for a laser printer, and more particularly, to a semiconductor laser capable of improving the printing uniformity of a laser printer.

BACKGROUND OF THE INVENTION

FIG. 4 shows a prior art semiconductor laser device for a laser printer. In FIG. 4, reference numeral 1 designates a laser chip for a laser printer. Facet protection films 2 comprising, for example, $Al_2O_3$, are produced at the front and rear laser facets of the laser chip. A metal wire 4 is connected to the laser chip 1. The laser chip 1 is mounted on a sub-mount 5 and the sub-mount 5 is disposed on a heat sink 6. An output laser light beam 7 is emitted from the front facet of the laser chip 1 and a monitor laser light beam 8 is emitted from the rear facet of the laser chip 1.

FIG. 5 shows a semiconductor laser used for the device. In FIG. 5, reference numeral 11 designates a p-type GaAs substrate. A p-type AlGaAs cladding layer 12 is disposed on the p-type GaAs substrate 11. An n-type GaAs current blocking layer 13 is disposed on the p-type AlGaAs cladding layer 12. A p-type AlGaAs cladding layer 14 is disposed on the n-type GaAs current blocking layer 13. An undoped AlGaAs active layer 15 is disposed on the p-type AlGaAs cladding layer 14. An n-type AlGaAs cladding layer 16 is disposed on the undoped active layer 15. An n-type GaAs contact layer 17 is disposed on the n-type AlGaAs cladding layer 16. A p-side electrode 18 is disposed on the p-type GaAs substrate 11 and an n-side electrode 19 is disposed on the n-type GaAs contact layer 17.

When a current larger than a threshold current flows through the semiconductor laser 1, laser oscillation occurs and laser light beams are emitted from both of the front and rear facets of the laser chip. The laser beam 8 emitted from the rear facet is utilized as a monitor light. Facet protection films 2 comprising, for example, $Al_2O_3$, are provided at the laser light emission facets in order to prevent oxidation of the facets. When the facet is oxidized, light absorption at the facet surfaces increases, generating heat due to the laser light absorption at the surface. The crystal in the vicinity of the facet may melt thereby destroying the laser device. Herein, the reflectivity of the facet is about 30 % regardless of the existence of the protection film 2.

Generally, a semiconductor laser used in a laser printer is pulsed. In this case, the laser light output gradually decreases with the passage of time during each pulse, as shown in FIG. 6. In FIG. 6, reference characters ($P_A$) and ($P_B$) respectively represent laser light output direct after the start of laser oscillation and directly before the end of laser oscillation and reference character (t) represents the time period during which the laser is switched on.

When the laser is switched on and off at a constant operating current as described above, the laser light output transiently decreases. The degree of the transient decrease in the laser light output during pulsed operation is represented as a droop. The droop is defined in the following equation, referring to FIG. 6.

$$\Delta P = \frac{P_A - P_B}{P_B} \times 100 \, (\%) \tag{1}$$

Because the printing density of the laser printer is determined uniquely by the laser light output, when the droop $\Delta P$ is large, printing intensity variations are generated. Accordingly, it is necessary to reduce the droop $\Delta P$ in order to obtain a printing result having no variation. In the semiconductor laser for a laser printer having a construction as shown in FIG. 1, however, the droop $\Delta P$ is larger than 10 %, and there is a possibility that printing variations will occur with that value of droop.

SUMMARY OF THE INVENTION

An object of the present invention is to provide an improved semiconductor laser for a laser printer which has a lower value of droop and no possibility of generating printing blurs.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to the present invention, a reflection film having reflectance of 45 to 65 % is provided at the laser facet from which laser light is output. Thus, the external differential quantum efficiency is lowered and the difference between the operation current and the threshold current is increased. Accordingly, the influence on light output caused by variations in the threshold current are reduced, and the droop $\Delta P$ is lowered.

DETAILED DESCRIPTION OF THE PREFERRED EMBODIMENTS

An embodiment of the present invention will be described in detail with reference to the drawings.

Figure 1:
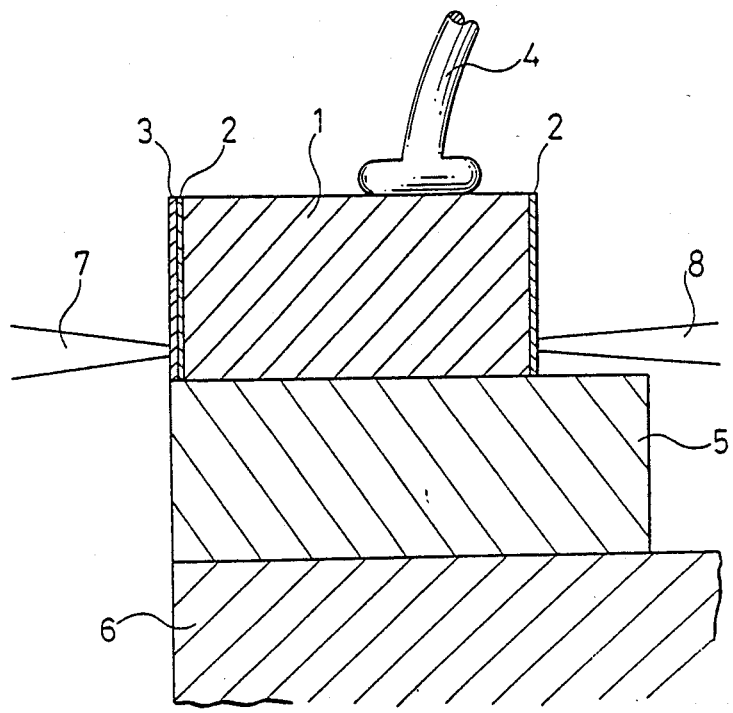
FIG. 1(a) is a sectional view of semiconductor laser for a laser printer according to an embodiment of the present invention and FIG. 1(b) is a detailed sectional view of a reflectivity film according to an embodiment of the invention.
Figure 1:
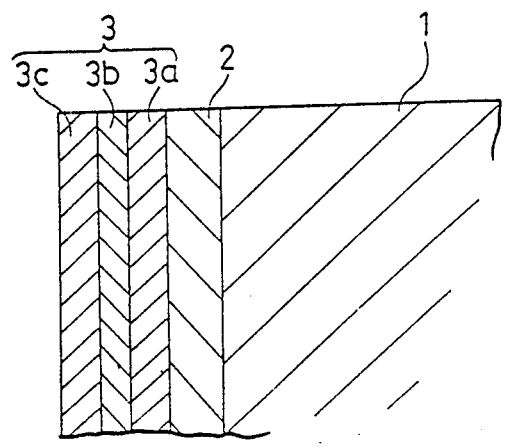

FIG. 1(a) shows a semiconductor laser for a laser printer according to an embodiment of the present invention and FIG. 1(b) shows an enlarged view of a portion of the front facet of the semiconductor laser chip of FIG. 1(a). In FIG. 1, the semiconductor chip 1 has a cross-section having the structure shown in FIG.

5. A pair of surface protection films 2 comprising, for example, $Al_2O_3$ are produced on the front and rear facets of the laser chip 1 from which laser light is output. A metal wire 4 is connected to the laser chip 1. The laser chip 1 is mounted on a sub-mount 5 and the sub-mount 5 is disposed on a heat sink 6. An output laser light beam 7 is emitted from the front facet of the laser chip 1 and a monitor laser light beam 8 is emitted from the rear facet of the laser chip 1. A reflection film 3 is disposed on the front facet of the laser chip 1. In FIG. 1(b), reference numeral 3a designates an $Al_2O_3$ film, reference numeral 3b designates an amorphous silicon film and reference numeral 3c designates an $Al_2O_3$ film.

The method for analyzing the droop quantitatively will be described.

The droop phenomenon is caused by a reduction in laser light output due to an increase in of the threshold current which is also due to a temperature increase of the active region of the semiconductor laser. When the temperature increase of the active region is Tj, $P_A$ and $P_B$ are represented by $$P_A = \eta\, df \frac{h\nu}{q} (I_{OP} - I_{th}) \tag{2}$$

$$P_B = \eta\, df \frac{h\nu}{q} \left\{ I_{OP} - I_{th} \cdot \exp\left(\frac{\Delta T_j}{T_0}\right) \right\} \tag{3}$$

Herein,
  $\eta_{df}$:external differential quantum efficiency of the front facet
  $\nu$:frequency of laser light
  h:Planck's constant
  q:electron charge
  $I_{th}$:threshold current
  $I_{op}$:operating current
  $T_o$:characteristic temperature Herein, external differential quantum efficiency is the conversion efficiency from electrical current to light in percent (%) when a current is injected into the laser.

When the formulae (2) and (3) are introduced into the formula (1), the droop becomes:

$$\Delta P = \frac{P_A - P_B}{P_B} \times 100\ (\%) \tag{4}$$

$$= \frac{I_{th}\left\{\exp\left(\frac{\Delta T_j}{T_o}\right) - 1\right\}}{I_{OP} - I_{th} \cdot \exp\left(\frac{\Delta T_j}{T_o}\right)} \times 100\ (\%)$$

The characteristic temperature of the semiconductor laser $T_0$ is 180° K and this is quite large compared with $\Delta T_j$. Accordingly, $$\Delta T_j/T_0 \ll 1$$

and in this case, the formula (4) is approximated by:

$$\Delta P \approx \frac{1}{(I_{OP}/I_{th}) - 1} \cdot \frac{\Delta T_j}{T_o} \times 100\ (\%) \tag{5}$$

From the formula (5), it can be seen that droop P can be reduced by increasing the term $(I_{op}/I_{th}) - 1$. Because $P_A$ and h/q take constant values in the above-described formula (2), in order to increase $(I_{op}/I_{th})$, it is required that the external differential quantum efficiency $\eta_{df}$ be decreased.

In order to calculate $\Delta P$ from formula (5), the value of $\Delta T_j$ has to be obtained. The value of $\Delta T_j$ is obtained by solving differential equation (6).

$$C\frac{d(\Delta T_j)}{dt} = I_{OP} \cdot V_{OP} - \frac{\Delta T_j}{R_{th}} \tag{6}$$

Herein,
  C:thermal capacitance of the laser
  $V_{op}$:operating voltage between electrodes of the laser When the differential equation (6) is solved, the following equation is obtained.

$$\Delta T_j = I_{OP} \cdot V_{OP} \cdot R_{th}\left\{ 1 - \exp\left(\frac{-t}{C \cdot Rh}\right)\right\} \tag{7}$$

Herein, $R_{th}$:thermal resistance of the laser.

When the formula (4) or formulae (5) and (7) are calculated, the droop $\Delta P$ is obtained.

From the above, as $\eta_{df}$ increases, $\Delta p$ increases.

Accordingly, in order to reduce the $\Delta P$, it is required to reduce the external differential quantum efficiency.

As a concrete example of reducing the external differential quantum efficiency $\eta_{df}$, the front facet reflectivity Rf of the laser chip 1 may be increased. The relationship between the $\eta_{df}$, Rf and the rear facet reflectivity Rr is represented by the following formula.

$$\eta\, df = \frac{\sqrt{Rr}\,(1 - Rf)}{\sqrt{Rr}\,(1 - Rf) + \sqrt{Rf}\,(1 - Rr)} \cdot \frac{\frac{1}{2L}\ln\left(\frac{1}{Rf} \cdot \frac{1}{Rr}\right)}{\alpha + \frac{1}{2L}\ln\left(\frac{1}{Rf} \cdot \frac{1}{Rr}\right)} \tag{8}$$

Herein,
  $\alpha$:internal loss
  L:cavity length

From the formula (8), when the Rf is increased, the $\eta_{df}$ is decreased.

Figure 2:
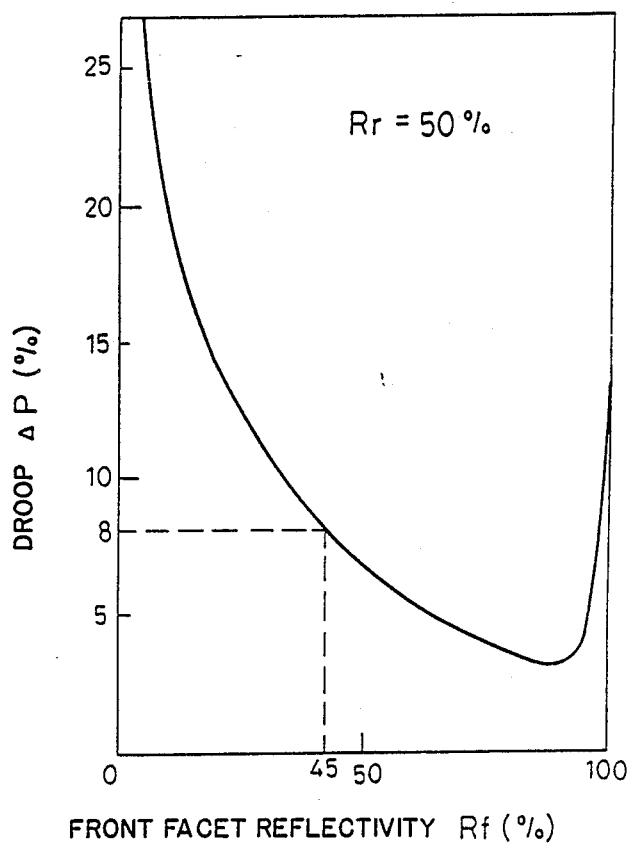
FIG. 2 is a diagram of the relationship between the droop $\Delta P$ and the front facet reflectivity Rf.

FIG. 2 shows the relationship between the droop $\Delta P$ and the front facet reflectivity Rf of the laser chip. From this FIG. 2, it can be seen that as Rf increases, $\Delta P$ is reduced. The upper limit of the droop $\Delta P$ where no printing depth variations occur in a laser printer is 8%. From FIG. 2, it can be seen that for $\Delta P < 8\%$, Rf should be above 45%.

As discussed above, in order to lower the droop $\Delta P$, Rf must be increased. When the Rf is increased, however, the light density in the neighborhood of the facet is raised while the droop $\Delta P$ is lowered. Accordingly, laser facet destruction due to COD (Catastrophic Optical Damage) is likely to occur, reducing reliability. The following relationship exists between external light output $P_0$ in the COD and the internal light intensity at the neighborhood of the laser facet, using Rf.

$$P_O = \frac{1 - Rf}{1 + Rf} P_i \tag{9}$$

Figure 3:
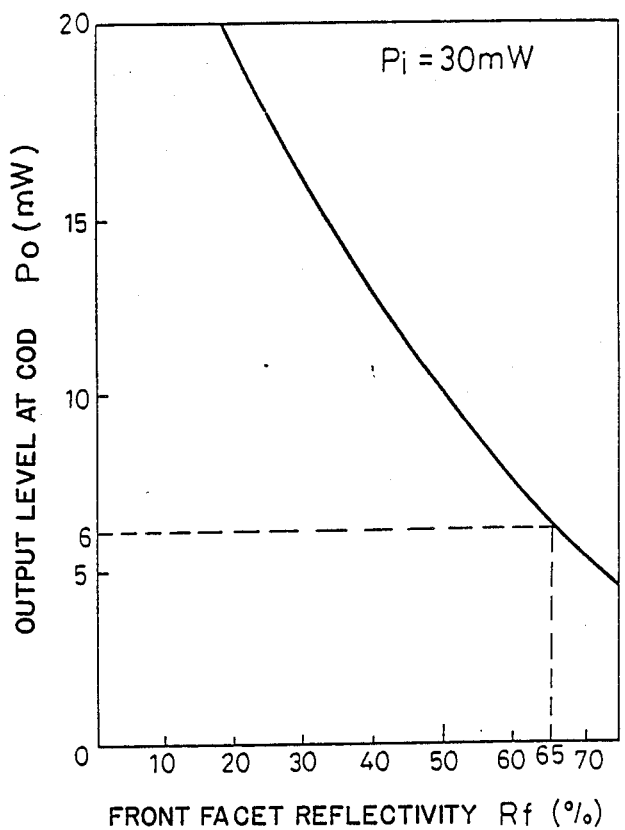
FIG. 3 is a diagram of the relationship between the external light output level at COD $P_0$ and the front facet reflectivity Rf.
Figure 4:
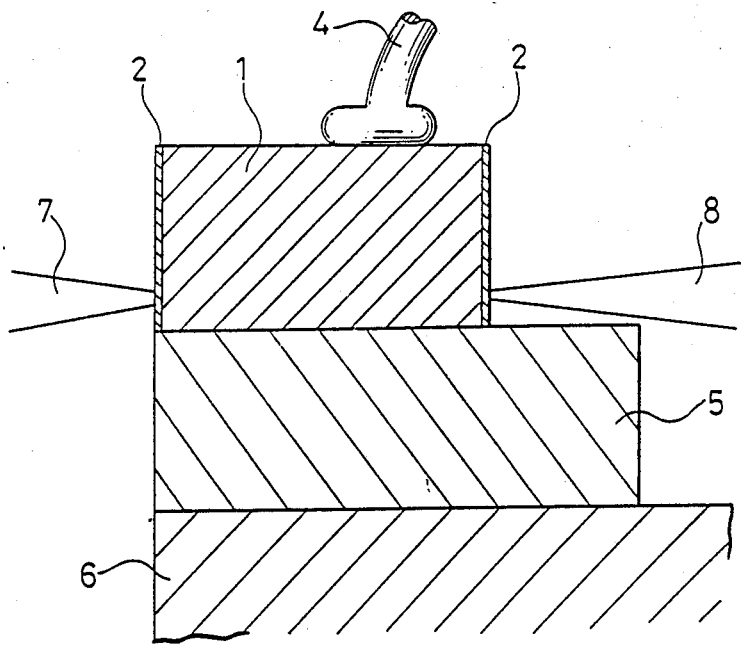
FIG. 4 is a diagram showing a semiconductor laser for laser printer according to the prior art.
Figure 6:
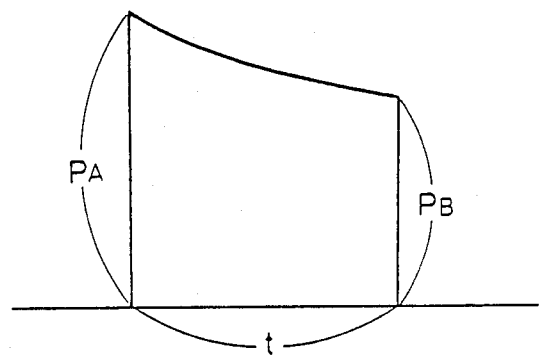
FIG. 6 is a diagram of the reduction of laser light output during pulsed operation of a laser.
Figure 5:
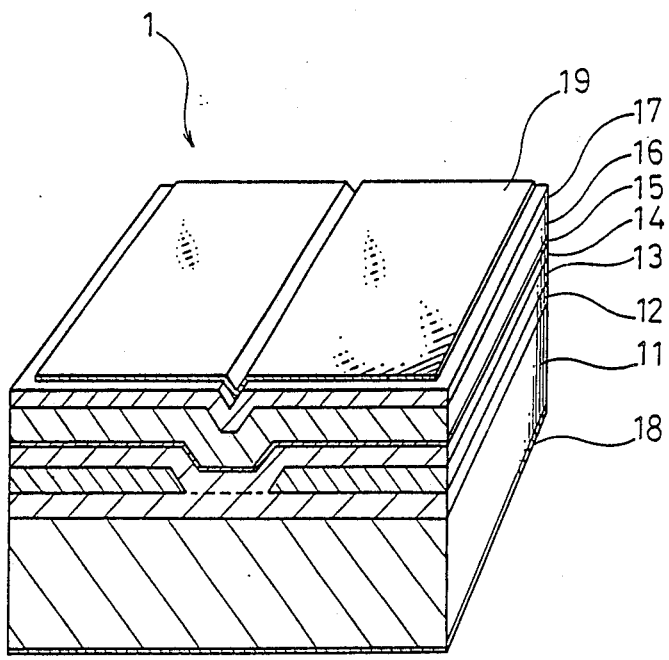
FIG. 5 is a perspective view of a semiconductor laser which is used in both laser devices according to the prior art and according to an embodiment of the present invention.

FIG. 3 shows the relationship between the external light output P₀ at COD and the front facet reflectivity Rf which is obtained calculated from formula (9). Herein, the internal light intensity Pi in the neighborhood of the laser facet at COD is constant at 30 mW regardless of the value of Rf. Because the laser for a printer is generally used at a light output of about 3 mW, the output level at COD is desired to be above about 6 mW which is twice of the above-described practical level. Accordingly, Rf has to be below 65% from FIG. 3.

As described above, as a result of research into the relationship between the droop and the front facet reflectivity and the relationship between the external light output at COD and the front facet reflectivity, the front facet reflectivity Rf of the laser chip has to be within 45%<Rf<65%.

As a means for realizing the above-described Rf, the construction of the reflection film 3 as shown in FIG. 1b, that is, a triple layer structure comprising Al₂O₃/a-Si/Al₂O₃ is preferred.

Then, if the layer thicknesses of $d_1$, $d_2$, and $d_3$ are as in the following, $$d_1 = d_3 = \frac{\pi \lambda_0}{4 n_1} \quad (11)$$

$$d_2 = \frac{\pi \lambda_0}{4 n_2} \quad (12)$$

Rf becomes 50%. Herein, $\lambda_0$: wavelength of laser light $n_1$: refractive index of Al₂O₃ (at light of wavelength $\lambda_0$)

$n_2$: refractive index of a-Si (at light of wavelength $\lambda_0$)

While in the above-described enbodiment the construction of reflection film 3 comprises a triple layer structure comprising Al₂O₃, a-Si, and Al₂O₃, the present invention may not restricted thereto. Table 1 shows other construction of a reflection film 3 and the reflectivity Rf thereof together with the above-described construction. In the table, reference numerals 3a, 3b, 3c, and 3d represent the first, second, third, and fourth layer in the order from below, and all the layers have a quarter wavelength layer thickness.

TABLE 1

|   | 3a | 3b | 3c | 3d | Rf (%) |
|---|----|----|----|----|--------|
| 1 | Al₂O₃ | a-Si | SiO₂ |  | 60 |
| 2 | Al₂O₃ | a-Si | Al₂O₃ |  | 50 |
| 3 | SiO₂ | a-Si | Al₂O₃ |  | 60 |
| 4 | a-Si | SiO₂ | a-Si | Al₂O₃ | 60 |
| 5 | a-Si | Al₂O₃ | a-Si | SiO₂ | 60 |

As discussed above, according to the present invention, a reflection film is provided at the front facet of a semiconductor laser for a laser printer, and the facet reflectivity thereof is made 45% to 65%. Therefore, a semiconductor laser superior in droop characteristic, having no printing variations and superior reliability is obtained.

What is claimed is:

1. In a semiconductor laser device having two facets through which laser light is output, a multiple layer reflection film having a reflectivity of 45 to 65% including at least one layer of amorphous silicon (a-Si) and one layer of alumina (Al₂O₃) disposed on one of the laser output facets.

2. A semiconductor laser device as defined in claim 1 wherein said reflection film comprises a triple layer structure comprising Al₂O₃/a-Si/Al₂O₃.

3. A semiconductor device as defined in claim 1 wherein said reflection film comprises a triple layer structure comprising Al₂O₃/a-Si/SiO₂ wherein the Al₂O₃ layer is in contact with the laser output facet.

4. A semiconductor device as defined in claim 1 wherein said reflection film comprises a triple layer structure comprising SiO₂/a-Si/Al₂O₃ wherein the SiO₂ layer is in contact with the laser output facet.

5. A semiconductor device as defined in claim 1 wherein said reflection film comprises a four layer structure comprising a-Si/SiO₂/a-Si/Al₂O₃ wherein the Al₂O₃ layer is in contact with the laser output facet.

6. A semiconductor device as defined in claim 1 wherein said reflection film comprises a four layer structure comprising a-Si/Al₂O₃/a-Si/SiO₂ wherein the SiO₂ layer is in contact with the laser output facet.

7. A semiconductor device as defined in claim 1 wherein the reflection film includes at least three layers and the optical thicknesses of the respective layers are one-quarter of the wavelength of the laser light.

8. A semiconductor device as defined in claim 1 wherein said semiconductor laser device is disposed on a sub-mount which has a heat sink at a surface thereof opposite said laser device including facet protection films disposed on both of said facets.

9. A semiconductor device as defined in claim 8 wherein laser light output from the laser facet contacting the reflection film is utilized as a laser output beam said laser light output from the other laser facet is utilized as a monitor output.

10. A semiconductor device as defined in claim 8 wherein said laser facet protection film comprises Al₂O₃.

11. A semiconductor laser device defined in claim 8 wherein said sub-mount comprises silicon.

12. A semiconductor laser device defined in claim 8 wherein said heat sink comprises one of copper, gold and silver.

* * * * *